(12) United States Patent
Lin et al.

(10) Patent No.: US 10,595,116 B2
(45) Date of Patent: *Mar. 17, 2020

(54) HEADSET CONTROLLER

(71) Applicant: PIXART IMAGING INC., Hsin-Chu (TW)

(72) Inventors: Jung-Tai Lin, Hsin-Chu (TW); En-Feng Hsu, Hsin-Chu (TW); Han-Chang Lin, Hsin-Chu (TW)

(73) Assignee: PIXART IMAGING INC., Hsin-Chu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 16/418,211

(22) Filed: May 21, 2019

(65) Prior Publication Data

US 2019/0273981 A1 Sep. 5, 2019

Related U.S. Application Data

(63) Continuation of application No. 16/140,157, filed on Sep. 24, 2018, now Pat. No. 10,349,160, which is a continuation of application No. 15/655,456, filed on Jul. 20, 2017, now Pat. No. 10,123,107.

(30) Foreign Application Priority Data

Dec. 12, 2016 (TW) .............................. 105141056 A

(51) Int. Cl.
| | |
|---|---|
| *H04R 1/10* | (2006.01) |
| *G06F 3/16* | (2006.01) |
| *H03K 17/96* | (2006.01) |
| *H03K 17/98* | (2006.01) |

(52) U.S. Cl.
CPC ............. *H04R 1/1041* (2013.01); *G06F 3/16* (2013.01); *G06F 3/165* (2013.01); *H03K 17/962* (2013.01); *H03K 17/9622* (2013.01); *H03K 17/98* (2013.01); *H03K 2217/9651* (2013.01); *H03K 2217/96054* (2013.01)

(58) Field of Classification Search
CPC ... H03K 2217/96054; H03K 2217/965; H03K 2217/96; H03K 2217/9622; H03K 2217/9607; H03K 2217/9651; H03K 17/96; H03K 17/962; H03K 17/9622; H03K 17/964; H03K 17/9645; G06F 2203/04105
USPC .......................................................... 381/74
See application file for complete search history.

(56) References Cited

U.S. PATENT DOCUMENTS

2010/0038227 A1* 2/2010 Lu .............................. G06F 3/01
200/5 A
2018/0046359 A1* 2/2018 Kim ....................... G06F 3/0414

FOREIGN PATENT DOCUMENTS

| CN | 202957954 U | 5/2013 |
|---|---|---|
| CN | 205283778 U | 6/2016 |
| CN | 105760011 * | 7/2016 |

(Continued)

*Primary Examiner* — William A Jerez Lora
(74) *Attorney, Agent, or Firm* — Li & Cai Intellectual Property (USA) Office

(57) ABSTRACT

A headset controller takes a first touch sensor, a second touch sensor, a first pressure sensor, and a second pressure sensor as a control medium for users. The headset controller can generate four different output instructions by the users touching or pressing the operating interface. The headset controller integrates various sensing methods to generate the needed output instructions.

10 Claims, 11 Drawing Sheets

(56) References Cited

FOREIGN PATENT DOCUMENTS

| | | |
|---|---|---|
| CN | 105760011 A | 7/2016 |
| KR | 101580570 B1 | 12/2015 |

\* cited by examiner

HEADSET CONTROLLER

CROSS-REFERENCE TO RELATED APPLICATIONS

The present disclosure is a Continuation Application claiming the benefit of and priority to U.S. patent application Ser. No. 15/655,456, filed on Jul. 20, 2017 and U.S. patent application Ser. No. 16/140,157, filed on Sep. 24, 2018, the entire contents of each of which being incorporated herein by reference.

BACKGROUND

1. Technical Field

The present disclosure relates to a headset controller, and in particular, to the headset controller having the functions of adjusting volume and selecting songs.

2. Description of Related Art

In general, conventional headset controllers use mechanical buttons or touch sensing blocks to correspondingly generate a control instruction for adjusting the volume (such as volume up or down) or selecting a song (such as selecting the previous or next song). For example, the user operates a mechanical button to generate the control instruction indicating volume up. For another example, the user touches a sensing block to generate the control instruction indicating a selection of the next song.

A conventional headset controller that can generate four control instructions by the touch sensing method needs to respectively configure four sensing blocks to generate the corresponding control instructions. Therefore, if a headset controller can integrate a variety of sensing methods to generate the needed control instructions, the flexibility in operation will be enhanced.

SUMMARY

An exemplary embodiment of the present disclosure provides a headset controller, which includes a first sensing line, a second sensing line, a first driving line, a second driving line, a driver, a receiver, and a processor. The first driving line is intersected with the first sensing line by a first touch sensor. The first driving line is intersected with the second sensing line by a first pressure sensor. The second driving line is intersected with the first sensing line by a second touch sensor. The second driving line is intersected with the second sensing line by a second pressure sensor. The driver is coupled to the first driving line and the second driving line. The driver is periodically and un-simultaneously configured for providing a power to the first driving line and the second driving line according to a control signal to respectively generate a first voltage on the first sensing line and a second voltage on the second sensing line. The receiver is coupled to the first sensing line and the second sensing line. The receiver is configured for determining a sensing status of the first touch sensor, the first pressure sensor, the second touch sensor, and the second pressure sensor according to the control signal, the first voltage, and the second voltage. The processor is coupled to the receiver and is configured for generating an output instruction according to the sensing status.

Furthermore, the first touch sensor is disposed on the first pressure sensor, and there is a predefined distance between the first pressure sensor and the first touch sensor.

Furthermore, the second touch sensor is disposed on the second pressure sensor, and there is a predefined distance between the second pressure sensor and the second touch sensor.

To sum up, the present disclosure provides a headset controller, which uses a touch sensor and a pressure sensor as a control medium, to provide two different control instructions for users touching or pressing an operating interface. Accordingly, the headset controller integrates various sensing methods to generate the control instructions, thereby enhancing flexibility in operation.

In order to further understand the techniques, means and effects of the present disclosure, the following detailed descriptions and appended drawings are hereby referred to, such that, and through which, the purposes, features and aspects of the present disclosure can be thoroughly and concretely appreciated; however, the appended drawings are merely provided for reference and illustration, without any intention to be used for limiting the present disclosure.

BRIEF DESCRIPTION OF THE DRAWINGS

The accompanying drawings are included to provide a further understanding of the present disclosure, and are incorporated in and constitute a part of this specification. The drawings illustrate exemplary embodiments of the present disclosure and, together with the description, serve to explain the principles of the present disclosure.

DESCRIPTION OF THE EXEMPLARY EMBODIMENTS

Figure 1:
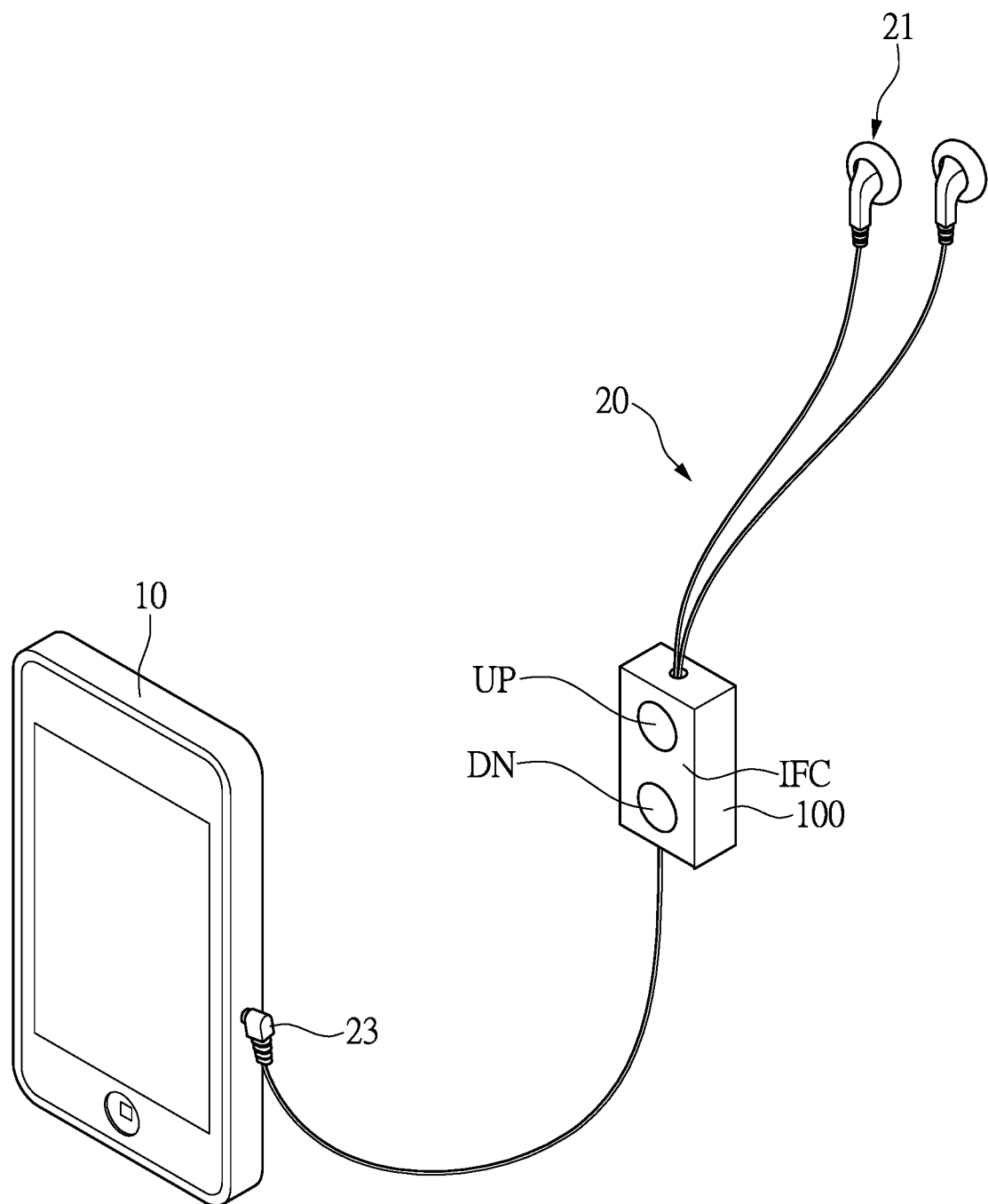
FIG. 1 shows a diagram of a headset controller according to an embodiment of the present disclosure.

Reference will now be made in detail to the exemplary embodiments of the present disclosure, examples of which are illustrated in the accompanying drawings. Wherever possible, the same reference numbers are used in the drawings and the description to refer to the same or like parts.

The present disclosure provides a headset controller, which takes a first touch sensor, a second touch sensor, a first pressure sensor, and a second pressure sensor as a control medium for users, to generate four different output instructions by a user touching or pressing the operating interface. Accordingly, the headset controller integrates various sensing methods to generate the needed output instructions (e.g., four control instructions indicating volume up, volume down, selecting the previous song, and selecting the next song), thereby enhancing flexibility in operation.

In addition, the positional relationship among touch sensors and pressure sensors can reduce the occupation of the operating interface, i.e., one sensing block corresponds to two output instructions. When the headset controller generates four output instructions by sensing methods, the conventional headset controller needs to provide four sensing blocks under the limited space of the operating interface, but the headset controller of the exemplary embodiment only needs to provide two sensing blocks, thereby enhancing the convenience in touch operation. The headset controller provided in the exemplary embodiment of the present disclosure will be described in the following paragraph.

Referring to FIG. 1, which shows the diagram of a headset controller according to an embodiment of the present disclosure, the headset controller 20 includes an earphone 21, a headset controller 100, and an audio connector 23. The headset controller 100 is disposed between the earphone 21 and the audio connector 23. When the audio connector 23 connects to an electronic device 10 (e.g., a smart phone, an MP3 player, etc.) assembled with the headset device 20, the audio signal can be transmitted to the earphone 21 for a user's listening. An upper sensing block UP and a lower sensing block DN are disposed on the operating interface IFC of the headset controller 100 to generate the different output instructions by the user touching or pressing the sensing blocks of the operating interface IFC. For example, the user touches the upper sensing block UP to generate the output instruction indicating volume up to the electronic device 10. The user presses the upper sensing block DN to generate the output instruction indicating selecting the next song to the electronic device 10. The inner structures of the headset controller 100 provided in the exemplary embodiment of the present disclosure will be described in the following paragraph.

Figure 2:
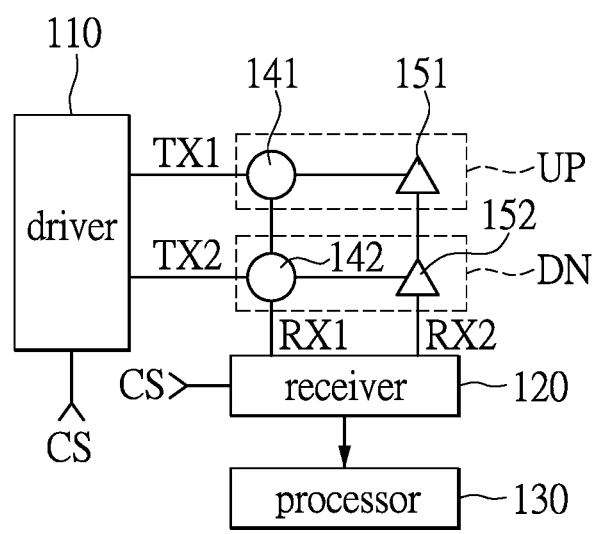
FIG. 2 shows a detailed diagram of a headset controller according to an embodiment of the present disclosure.

Referring to FIG. 2 in conjunction with FIG. 1, FIG. 2 shows the detail diagram of a headset controller according to an embodiment of the present disclosure. As shown in FIG. 2, the headset controller 100 includes a first driving line TX1, a second driving line TX2, a first sensing line RX1, a second sensing line RX2, a driver 110, a receiver 120, and a processor 130. The first driving line TX1 is intersected with the first sensing line RX1 by a first touch sensor 141. The first driving line TX1 is intersected with the second sensing line RX2 by a first pressure sensor 151. The second driving line Tx2 is intersected with the first sensing line RX1 by a second touch sensor 142. The second driving line TX2 is intersected with the second sensing line RX2 by a second pressure sensor 152. In the present disclosure, the first touch sensor 141 and the second touch sensor 142 are capacitive touch sensors. The first pressure sensor 151 and the second pressure sensor 152 are capacitive pressure sensors.

Figure 3:
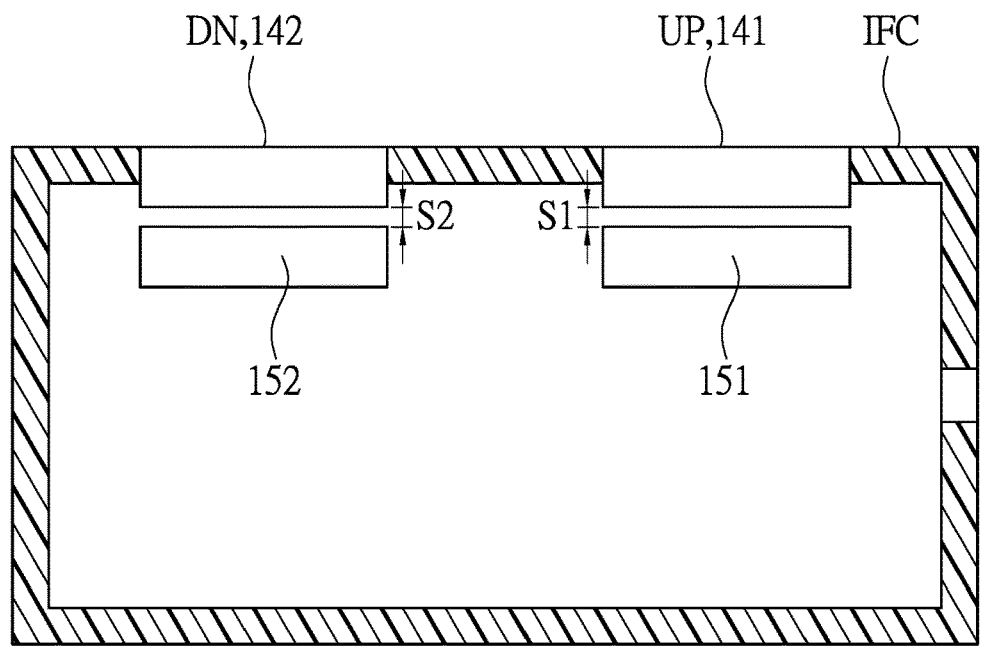
FIG. 3 shows a diagram of a positional relationship among the first touch sensor, the first pressure sensor, the second touch sensor, and the second pressure sensor according to an embodiment of the present disclosure.

Referring to FIG. 3, the first touch sensor 141 is disposed at a position within the upper sensing block UP of the operating interface IFC. The first pressure sensor 141 is disposed on the first pressure sensor 151. There is a predefined distance S1 between the first pressure sensor 151 and the first touch sensor 141. The second touch sensor 142 is disposed at a position within the lower sensing block DN of the operating interface IFC. The second touch sensor 142 is disposed on the second pressure sensor 152. There is a predefined distance S2 between the second pressure sensor 152 and the second touch sensor 142. Accordingly, the user can generate different output instructions by touching or pressing the upper sensing block UP or the lower sensing block DN of the operating interface IFC.

More specifically, the first touch sensor 141 is disposed on an elastic element (not shown in FIGs), so that the first touch sensor 141 moves between the predefined distance S1. Therefore, when the user presses the first touch sensor 141 to move the predefined distance S1, the first touch sensor 141 touches the first pressure sensor 151 by an external force (i.e., the force of pressing the first touch sensor 141). Similarly, the second touch sensor 142 is disposed on an elastic element equally (not shown in FIGs), so that the second touch sensor 142 moves between the predefined distance S2. Therefore, when the user presses the second touch sensor 142 to move the predefined distance S2, the second touch sensor 142 touches the second pressure sensor 152 by an external force (i.e., the force of pressing the second touch sensor 142).

Figure 4A:
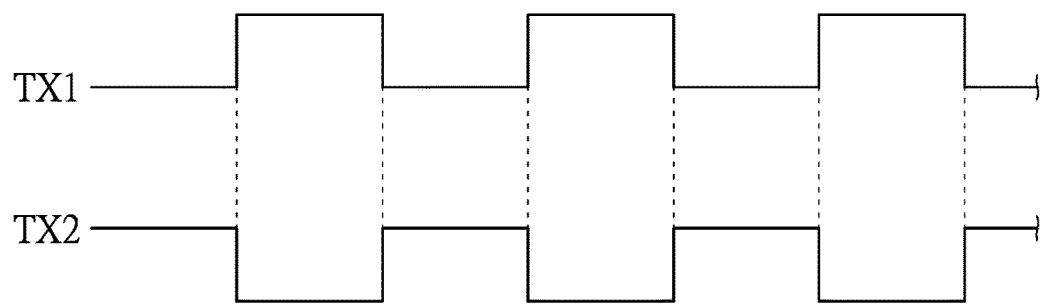
FIG. 4A shows the waveform of the signals on the first driving line and the second driving line according to an embodiment of the present disclosure.
Figure 4B:
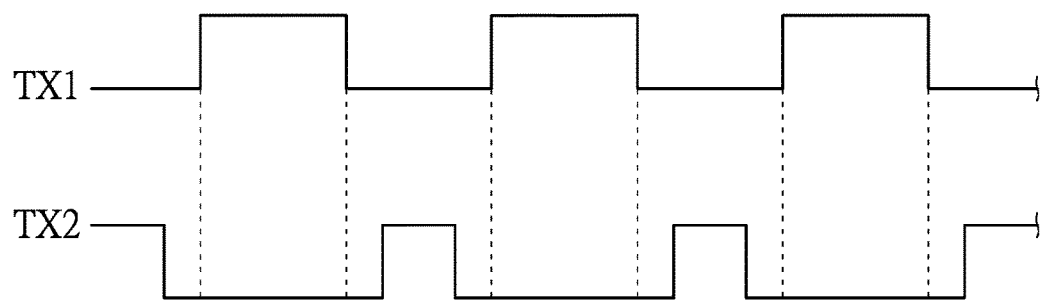
FIG. 4B shows the waveform of the signals on the first driving line and the second driving line according to another embodiment of the present disclosure.

Returning to FIG. 2, the driver 110 is coupled to the first driving line TX1 and the second driving line TX2. The driver 110 is periodically and un-simultaneously configured for providing a power to the first driving line TX1 and the second driving line TX2 according to a control signal CS, to respectively generate a first voltage on the first sensing line RX1 and a second voltage on the second sensing line RX2. In the present disclosure, as shown in FIG. 4A, when the first driving line TX1 and the second driving line TX2 receive the power provided from the driver 110, the first voltage on the first driving line TX1 and the second voltage on the second driving line TX2 are at a high potential. Conversely, when the first driving line TX1 and the second driving line TX2 does not receive the power provided from the driver 110, the first voltage on the first driving line TX1 and the second voltage on the second driving line TX2 are at a low potential. Therefore, the waveform of the first voltage on the first driving line TX1 and the waveform of the second voltage on the second driving line TX2 are inverse to each other In another disclosure, as shown in FIG. 4B, the time period during which the driver 110 provides the power to the first driving line TX1 can be longer than the time period during which the driver 110 provides the power to the second driving line TX2. Besides, the time period during which the driver 110 provides the power to the first driving line TX1 can be less than the time period during which the driver 110 provides the power to the second driving line TX2 (not shown in FIGs). The present disclosure is not limited thereto.

Returning to FIG. 2, the receiver 120 is coupled to the first sensing line RX1 and the second sensing line RX2. The receiver 120 is configured for determining a sensing status of the first touch sensor 141, the first pressure sensor 151, the second touch sensor 142, and the second pressure sensor 152 according to the control signal CS, the first voltage on the first sensing line RX1, and the second voltage on the second sensing line RX2. When the user touches or presses the upper sensing block UP or the lower sensing block DN of the operating interface IFC, the first voltage on the first sensing line RX1 or the second voltage on the second sensing line RX2 will change depending on the sensing status of the first or second touch sensors 141, 142 after being touched by the user, or the first or second pressure sensors 151, 152 after being pressed by the user.

Figure 5A:
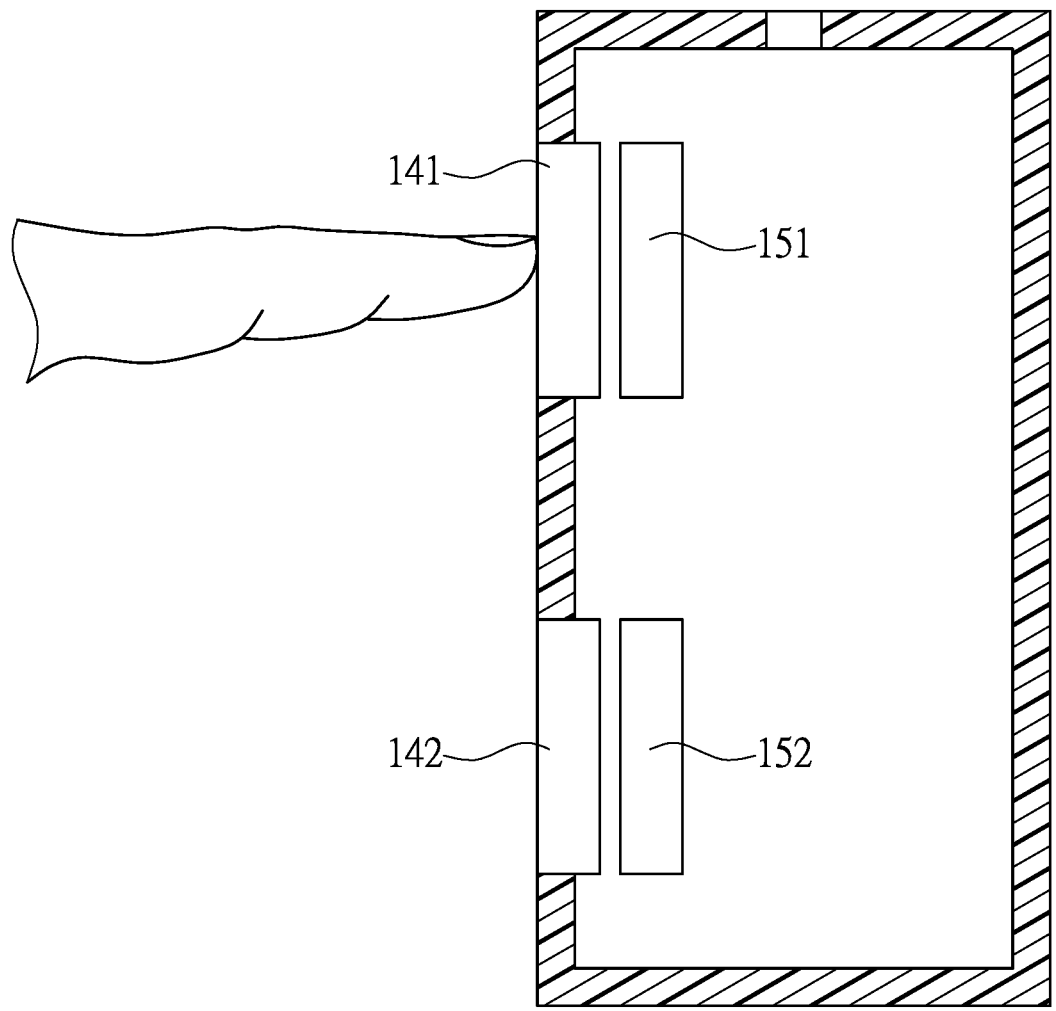
FIG. 5A shows a diagram of a user touching the first touch sensor according to an embodiment of the present disclosure.
Figure 5B:
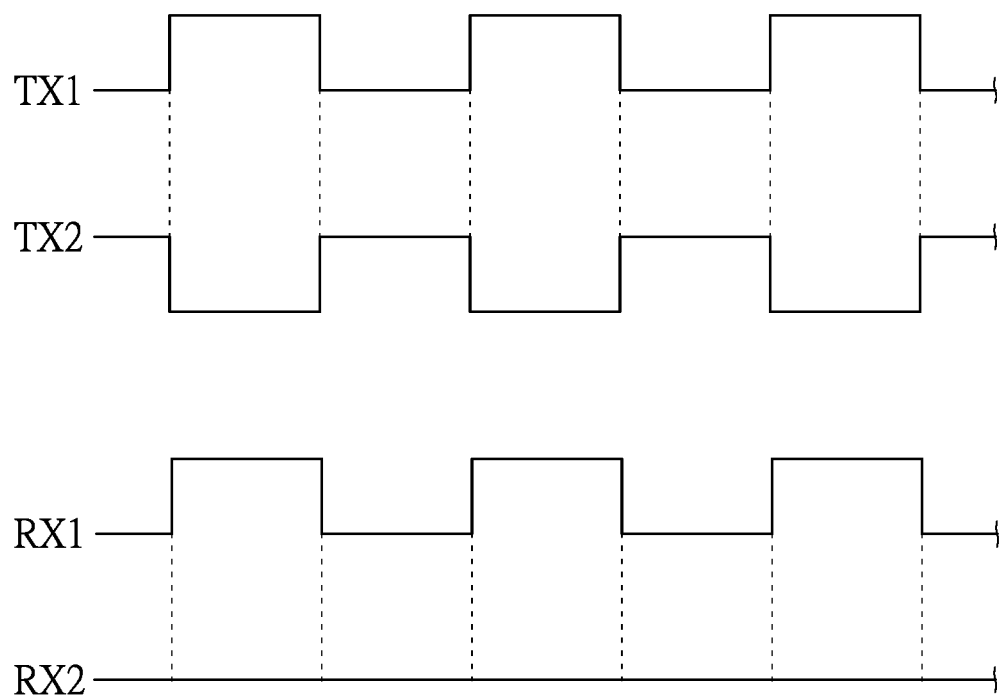
FIG. 5B shows the waveform of the signals on the first driving line, the second driving line, the first sensing line, and the second sensing line of FIG. 5A.

The sensing status determined by the receiver 120 when the user touches or presses the upper or lower sensing blocks UP, DN is further described in the following paragraph. The processor 130 is coupled to the receiver 120, and the processor 130 generates an output instruction according to the sensing status. As shown in FIGS. 5A and 5B, the user touches the first touch sensor 141 but does not press the first pressure sensor 151. When the control signal CS indicates that the driver 110 provides the power to the first driving line TX1 (e.g., the high potential on the first driving line TX1 shown in FIG. 5B), the first voltage on the first sensing line RX1 is at a touch potential (e.g., the high potential on the first sensing line RX1 shown in FIG. 5B) and the second voltage on the second sensing line RX2 is at a low potential. At this time, the receiver 120 determines that a touch event has occurred with the first touch sensor 141, and then transmits said sensing status to the processor 130. The processor 130 generates an output instruction, e.g., the output instruction indicating volume up, to the electronic device 10 according to the present sensing status, so that the electronic device 10 controls the volume.

Figure 6A:
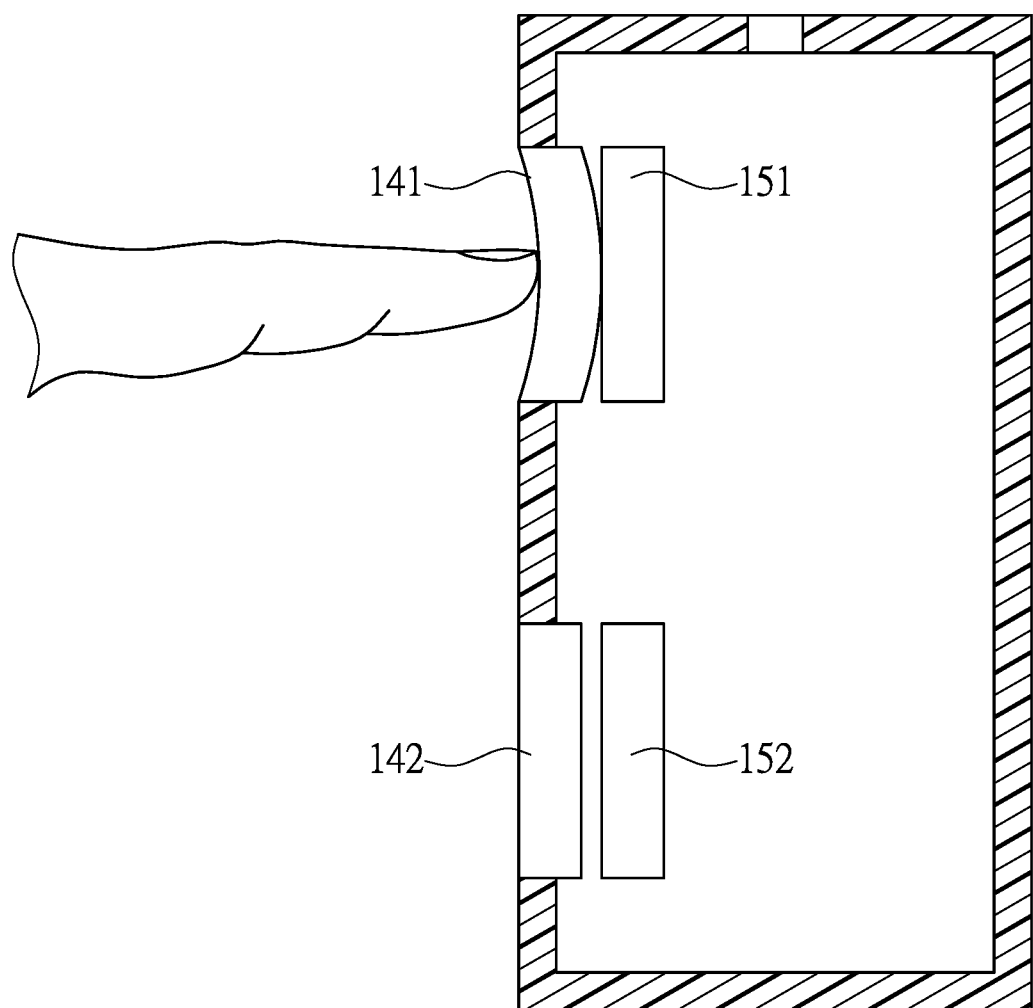
FIG. 6A shows a diagram of the user pressing the first pressure sensor according to an embodiment of the present disclosure.
Figure 6B:
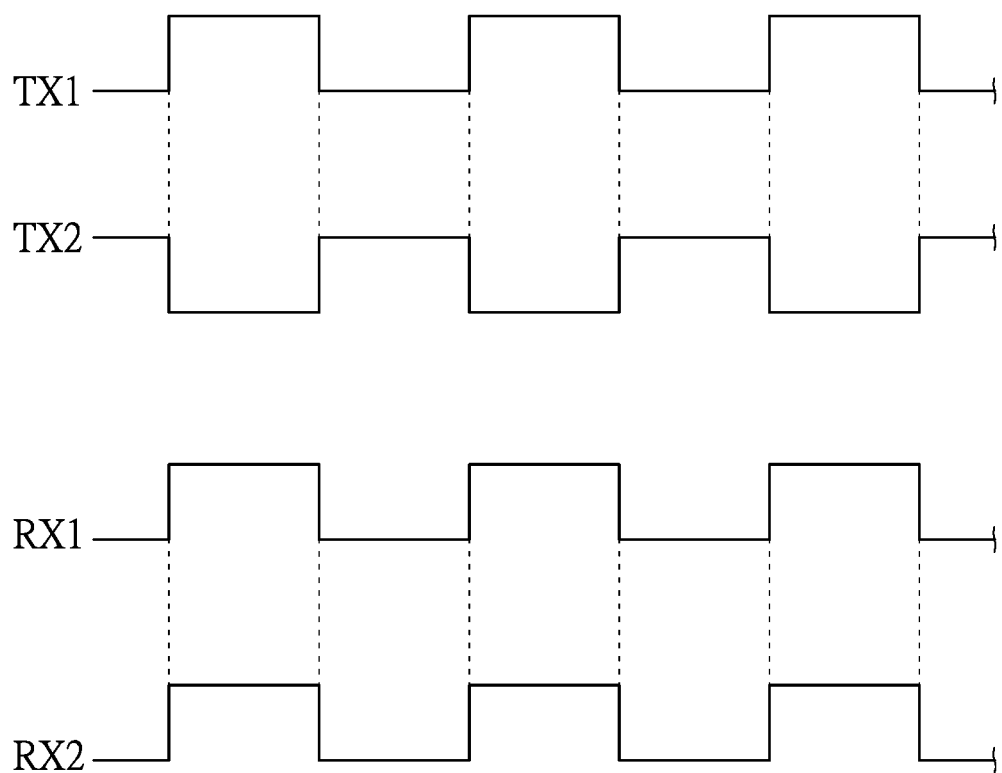
FIG. 6B shows the waveform of the signals on the first driving line, the second driving line, the first sensing line, and the second sensing line of FIG. 6A.

Referring to FIGS. 6A and 6B, the user touches the first touch sensor 141 and presses the first pressure sensor 151. When the control signal CS indicates that the driver 110 provides the power to the first driving line TX1 (e.g., the high potential on the first driving line TX1 shown in FIG. 6B), the first voltage on the first sensing line RX1 is at a touch potential (e.g., the high potential on the first sensing line RX1 shown in FIG. 6B), and the second voltage on the second sensing line RX2 is at a touch potential (e.g., the high potential on the second sensing line RX2 shown in FIG. 6B). At this time, the receiver 120 determines that a touch event has occurred with the first pressure sensor 151, and then transmits said sensing status to the processor 130. The processor 130 generates an output instruction, e.g., the output instruction indicates selecting the previous song, to the electronic device 10 according to the present sensing status, so that the electronic device 10 selects the song.

Figure 7A:
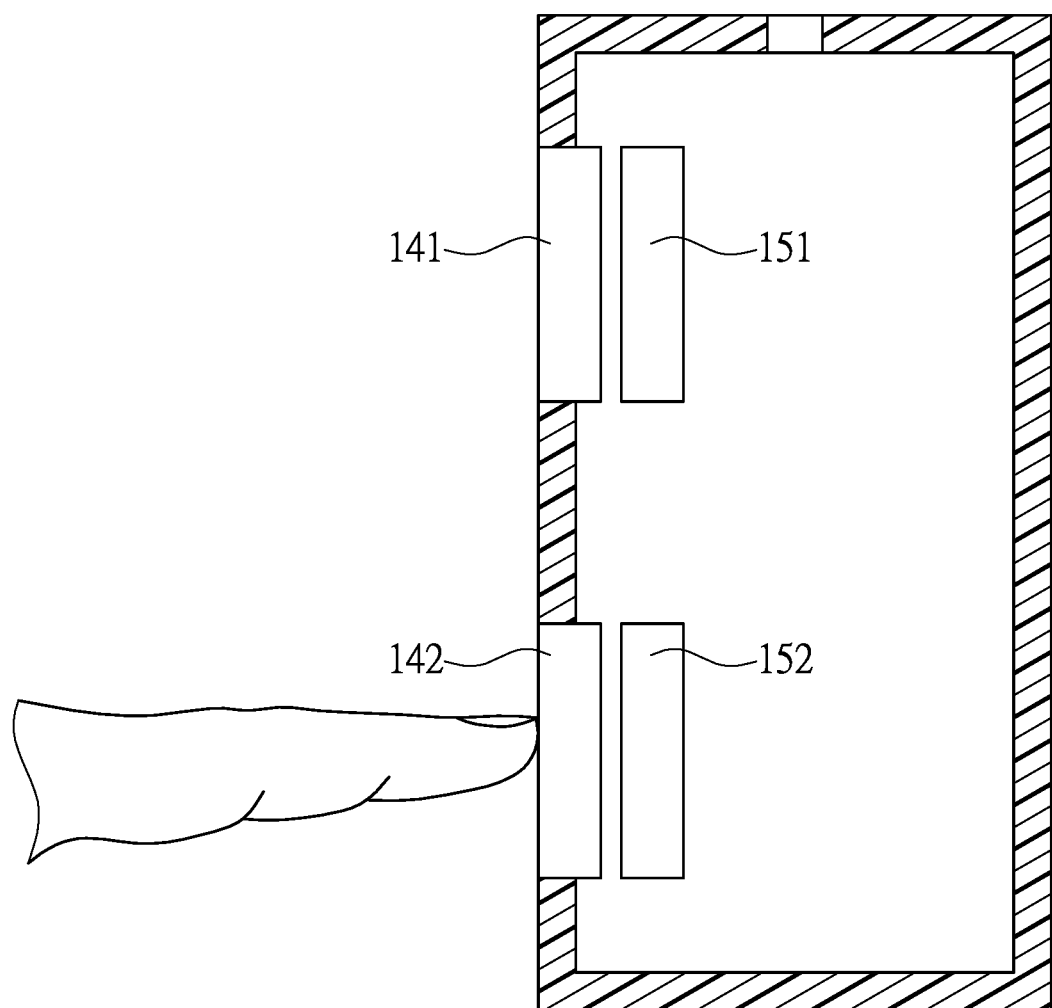
FIG. 7A shows a diagram of the user touching the second touch sensor according to an embodiment of the present disclosure.
Figure 7B:
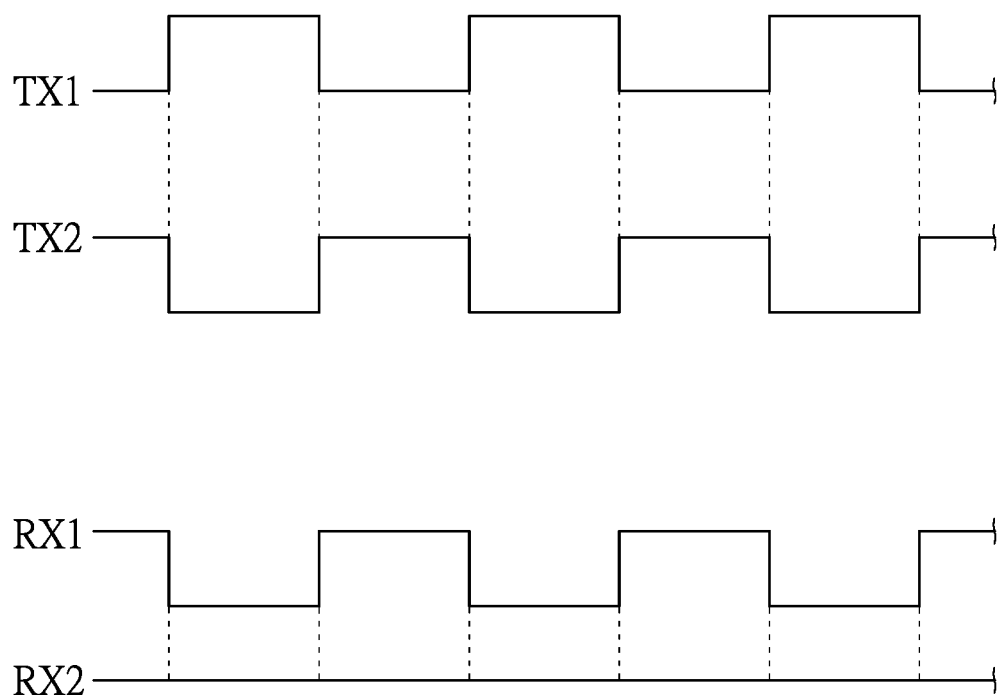
FIG. 7B shows the waveform of the signals on the first driving line, the second driving line, the first sensing line, and the second sensing line of FIG. 7A.

Referring to FIGS. 7A and 7B, the user touches the second touch sensor 142 and does not press the second pressure sensor 152. When the control signal CS indicates that the driver 110 provides the power to the second driving line TX2 (e.g., the high potential on the second driving line TX2 shown in FIG. 7B), the first voltage on the first sensing line RX1 is at a touch potential (e.g., the high potential on the first sensing line RX1 shown in FIG. 7B), and the second voltage on the second sensing line RX2 is at a low potential. At this time, the receiver 120 determines that a touch event has occurred with the second touch sensor 142, and then transmits said sensing status to the processor 130. The processor 130 generates an output instruction, e.g., the output instruction indicates the volume down, to the electronic device 10 according to the present sensing status, so that the electronic device 10 controls the volume.

Figure 8A:
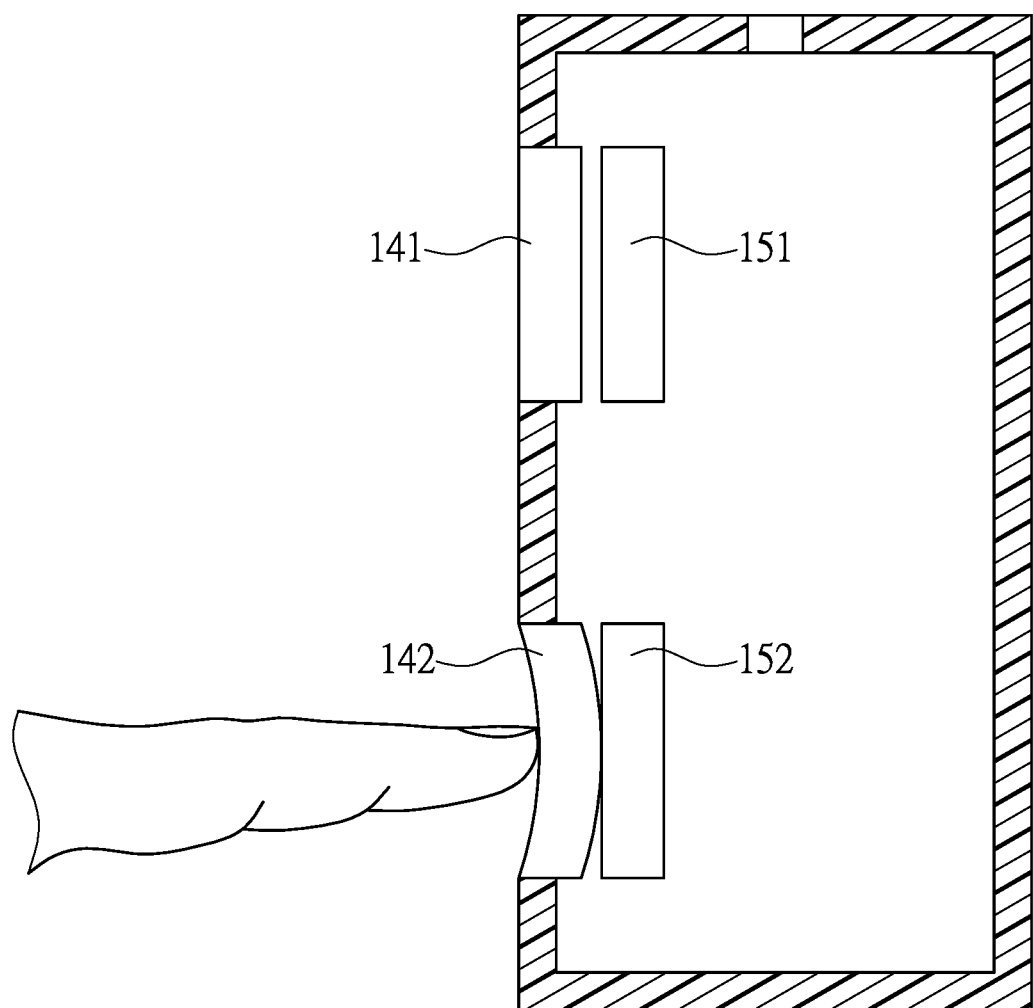
FIG. 8A shows a diagram of the user pressing the second pressure sensor according to an embodiment of the present disclosure.
Figure 8B:
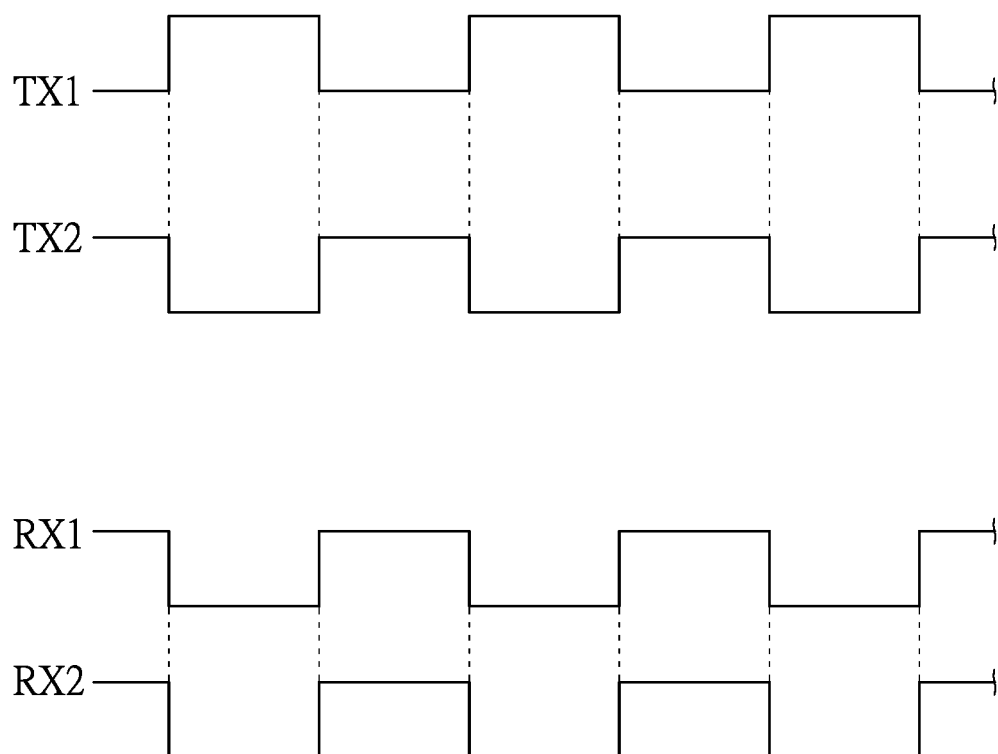
FIG. 8B shows the waveform of the signals on the first driving line, the second driving line, the first sensing line, and the second sensing line of FIG. 8A.

Referring to FIGS. 8A and 8B, the user touches the second touch sensor 142 and presses the sensor pressure sensor 152. When the control signal CS indicates that the driver 110 provides the power to the second driving line TX2 (e.g., the high potential on the second driving line TX2 shown in FIG. 8B), the first voltage on the first sensing line RX1 is at a touch potential (e.g., the high potential on the first sensing line RX1 shown in FIG. 8B), and the second voltage on the second sensing line RX2 is at a touch potential (e.g., the high potential on the second sensing line RX2 shown in FIG. 8B). At this time, the receiver 120 determines that a touch event has occurred with the second pressure sensor 152, and then transmits said sensing status to the processor 130. The processor 130 generates an output instruction, e.g., the output instruction indicates selecting the next song, to the electronic device 10 according to the present sensing status, so that the electronic device 10 selects the song.

Accordingly, the positional relationship among the first touch sensor 141, the second touch sensor 142, the first pressure sensor 151, and the second pressure sensor 152 can reduce the occupation of the operating interface IFC, i.e., one upper sensing block UP corresponds to two output instructions and one lower sensing block DN corresponds to two output instructions. Therefore, when the headset controller generates four output instructions by sensing methods, the traditional headset controller needs to provide four sensing blocks under the limited operating interface, but the headset controller 100 of the exemplary embodiment only needs to provide two sensing blocks (i.e., the upper sensing block UP and the lower sensing clock DN), thereby enhancing the convenience in touch operation.

In summary, the present disclosure provides a headset controller, which takes a first touch sensor, a second touch sensor, a first pressure sensor and a second pressure sensor as a control medium for users, to provide four different control instructions by the users touching or pressing the operating interface. Accordingly, the headset controller integrates various sensing methods to generate the needed control instructions (e.g., four output instructions indicating volume up, volume down, selecting the previous song, and selecting the next song), thereby enhancing flexibility in operation.

The above-mentioned descriptions represent merely the exemplary embodiment of the present disclosure, without any intention to limit the scope of the present disclosure thereto. Various equivalent changes, alterations or modifications based on the claims of present disclosure are all consequently viewed as being embraced by the scope of the present disclosure.

What is claimed is:

1. A headset controller, comprising:
   an operating interface, having an upper sensing block and a lower sensing block;
   a first touch sensor, disposed in the upper sensing block;
   a first pressure sensor, disposed in the upper sensing block;
   a second touch sensor, disposed in the lower sensing block;
   a second pressure sensor, disposed in the lower sensing block;
   a first sensing line and a second sensing line;
   a first driving line, intersected with the first sensing line by the first touch sensor, and intersected with the second sensing line by the first pressure sensor;
   a second driving line, intersected with the first sensing line by the second touch sensor, and intersected with the second sensing line by the second pressure sensor;

a driver, coupled to the first driving line and the second driving line, periodically and un-simultaneously configured for providing a power to the first driving line and the second driving line according to a control signal, to respectively generate a first voltage on the first sensing line and a second voltage on the second sensing line;

a receiver, coupled to the first sensing line and the second sensing line, configured for determining a sensing status of the first touch sensor, the first pressure sensor, the second touch sensor, and the second pressure sensor according to the control signal, the first voltage, and the second voltage; and a processor, coupled to the receiver, and configured for generating an output instruction according to the sensing status, wherein the first touch sensor and the first pressure sensor are disposed opposite to each other, and wherein the second touch sensor and the second pressure sensor are disposed opposite to each other.

2. The headset controller according to claim 1, wherein the first touch sensor is disposed on the first pressure sensor, and there is a predefined distance between the first pressure sensor and the first touch sensor.

3. The headset controller according to claim 1, wherein the first touch sensor is disposed on an elastic element, and the first touch sensor touches the first pressure sensor by an external force.

4. The headset controller according to claim 1, wherein the second touch sensor is disposed on the second pressure sensor, and there is a predefined distance between the second pressure sensor and the second touch sensor.

5. The headset controller according to claim 1, wherein the second touch sensor is disposed on an elastic element, and the second touch sensor touches the second pressure sensor by an external force.

6. The headset controller according to claim 1, wherein when the control signal indicates that the driver provides the power to the first driving line, the first voltage is at a touch potential, and the second voltage is at a low potential, the sensing status indicating that a touch event has occurred with the first touch sensor.

7. The headset controller according to claim 1, wherein when the control signal indicates that the driver provides the power to the first driving line, the first voltage is at a touch potential, and the second voltage is at the touch potential, the sensing status indicating that a touch event has occurred with the first pressure sensor.

8. The headset controller according to claim 1, wherein when the control signal indicates that the driver provides the power to the second driving line, the first voltage is at a touch potential, and the second voltage is at a low potential, the sensing status indicating that a touch event has occurred with the second touch sensor.

9. The headset controller according to claim 1, wherein when the control signal indicates that the driver provides the power to the second driving line, the first voltage is at a touch potential, and the second voltage is at the touch potential, the sensing status indicating that a touch event has occurred with the second pressure sensor.

10. The headset controller according to claim 1, wherein a waveform of the first voltage on the first driving line and a waveform of the second voltage on the second driving line are inverse to each other.

* * * * *